United States Patent [19]
Sine et al.

[11] Patent Number: 5,621,739
[45] Date of Patent: Apr. 15, 1997

[54] METHOD AND APPARATUS FOR BUFFER SELF-TEST AND CHARACTERIZATION

[75] Inventors: Christopher J. Sine, San Jose; Alper Ilkbahar, Santa Cruz; Tak M. Mak, Union City, all of Calif.

[73] Assignee: Intel Corporation, Santa Clara, Calif.

[21] Appl. No.: 643,954

[22] Filed: May 7, 1996

[51] Int. Cl.$^6$ .................................................. G01R 31/28
[52] U.S. Cl. ........................................ 371/22.1; 371/22.5
[58] Field of Search ................................... 371/22.1, 22.2, 371/22.4, 22.5, 22.6, 25.1, 28

[56] References Cited

U.S. PATENT DOCUMENTS

| | | | |
|---|---|---|---|
| 5,381,421 | 1/1995 | Dickol et al. | 371/27 |
| 5,400,057 | 3/1995 | Yin | 345/199 |

*Primary Examiner*—Vincent P. Canney
*Attorney, Agent, or Firm*—Blakely, Sokoloff, Taylor & Zafman

[57] ABSTRACT

A self-testing buffer circuit. The buffer circuit utilizes an adjustable delay circuit to test whether the buffer can capture a data value during a variable stroke window. The buffer includes an input circuit coupled to receive a data value generated by the self-testing buffer circuit. The buffer circuit also includes a latch which has a latch input coupled to receive the data value from the input circuit. An adjustable delay circuit having a delay adjust input is coupled to provide an adjustably delayed strobe to a clock input of the latch. A comparison circuit may be coupled to compare a latch output value to an expected value. The self-testing buffer circuit may be used in conjunction with serial or parallel test resisters to test the buffer performance for a variety of strobe delays and data values.

30 Claims, 5 Drawing Sheets

METHOD AND APPARATUS FOR BUFFER SELF-TEST AND CHARACTERIZATION

FIELD OF THE INVENTION

The present invention pertains to the field of integrated circuits. More specifically, the present invention relates to testing of buffer circuits on integrated circuits.

BACKGROUND

As integrated circuit features continue to shrink, test costs relentlessly rocket skyward. Greater numbers of interface nodes, higher operating frequencies, and specialized packaging arrangements such as multi-chip modules all contribute to soaring test costs.

To avoid wasting packaging materials and assembly costs, some tests are performed on an integrated circuit die prior to assembly. Equipment for testing integrated circuits before assembly increases in cost and complexity as die contacts decrease in size and increase in number. Indeed, the cost of exhaustive pre-assembly testing of every interface node of an integrated circuit is becoming prohibitive. Unfortunately, saving costs by reducing pre-assembly testing translates into increasing post-assembly waste.

Output buffers and input/output (I/O) buffers are features of an integrated circuit which typically must be thoroughly tested prior to sale. These buffers are ordinarily tested by test equipment which skews the relative relation between data signals and a clock or strobe signal until a failure is detected.

Source synchronous buffers are one type of buffer generally characterized in this manner. Source synchronous buffers operate by transmitting the strobe along with data from a driving chip to a receiving chip. With careful control over the signal paths, the transfer rate of information can be maximized because the strobe edge can be accurately placed to minimize the skew relative to the data.

At the destination, the strobe signal is used to create a window during which data should be captured. Manufacturing flaws or processing excursions adversely affecting the characteristics of the input or output circuitry may cause an input latch to fail to capture the data. For example, abnormal performance of a circuit which buffers the strobe signal could alter timing relationships sufficiently to cause failure under some operating conditions.

In order to detect such failures, prior art source synchronous testing typically uses expensive test equipment to provide data to each pin and appropriate strobe input. This scheme requires that a tester channel be assigned, or at least a tester interface be connected, to each buffer which is to be tested. This type of testing can be performed either before or after assembly. Prior art source synchronous buffer testing is also done in systems after the integrated circuits are assembled. This system testing also requires that each buffer tested is connected to another system component.

Thus prior art buffers can be characterized before packaging only by using expensive test equipment which contacts an interface node for each buffer. If testing is only performed after packaging, packaging materials and assembly costs may be wasted on parts having failures which could have been detected earlier.

SUMMARY

A self-testing buffer circuit of the present invention utilizes an adjustable delay circuit to test whether the buffer can capture a data value during a variable strobe window. The buffer includes an input circuit coupled to receive a data value generated by the self-testing buffer circuit. The buffer circuit also includes a latch coupled to receive the data value. An adjustable delay circuit having a delay adjust input is coupled to provide an adjustably delayed strobe to a clock input of the latch.

The buffer circuit may include a comparison circuit which is coupled to compare a latch output and an expected value. The buffer may also utilize serially linked scan cells or parallel test registers which capture the latch output. The self-testing buffer circuit may be used in conjunction with the serial or parallel test registers to test the buffer performance for a variety of strobe delays and data values.

BRIEF DESCRIPTION OF THE FIGURES

The present invention is illustrated by way of example and not limitation in the figures of the accompanying drawings.

DETAILED DESCRIPTION

The present invention provides a method and apparatus for buffer self-test and characterization. In the following description, numerous specific details are set forth such as particular register arrangements and delay mechanisms in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the described functions, will be able to implement the necessary logic circuits without undue experimentation.

The invention utilizes an adjustable delay circuit coupled with various types of control structures to effectuate self-testing and/or characterization of buffer circuits. This invention advantageously allows testing of buffers without requiring costly test equipment to access each interface node. Consequently, one advantageous application of the invention reduces test costs and also still allows pre-assembly testing of buffer circuits.

Figure 1:
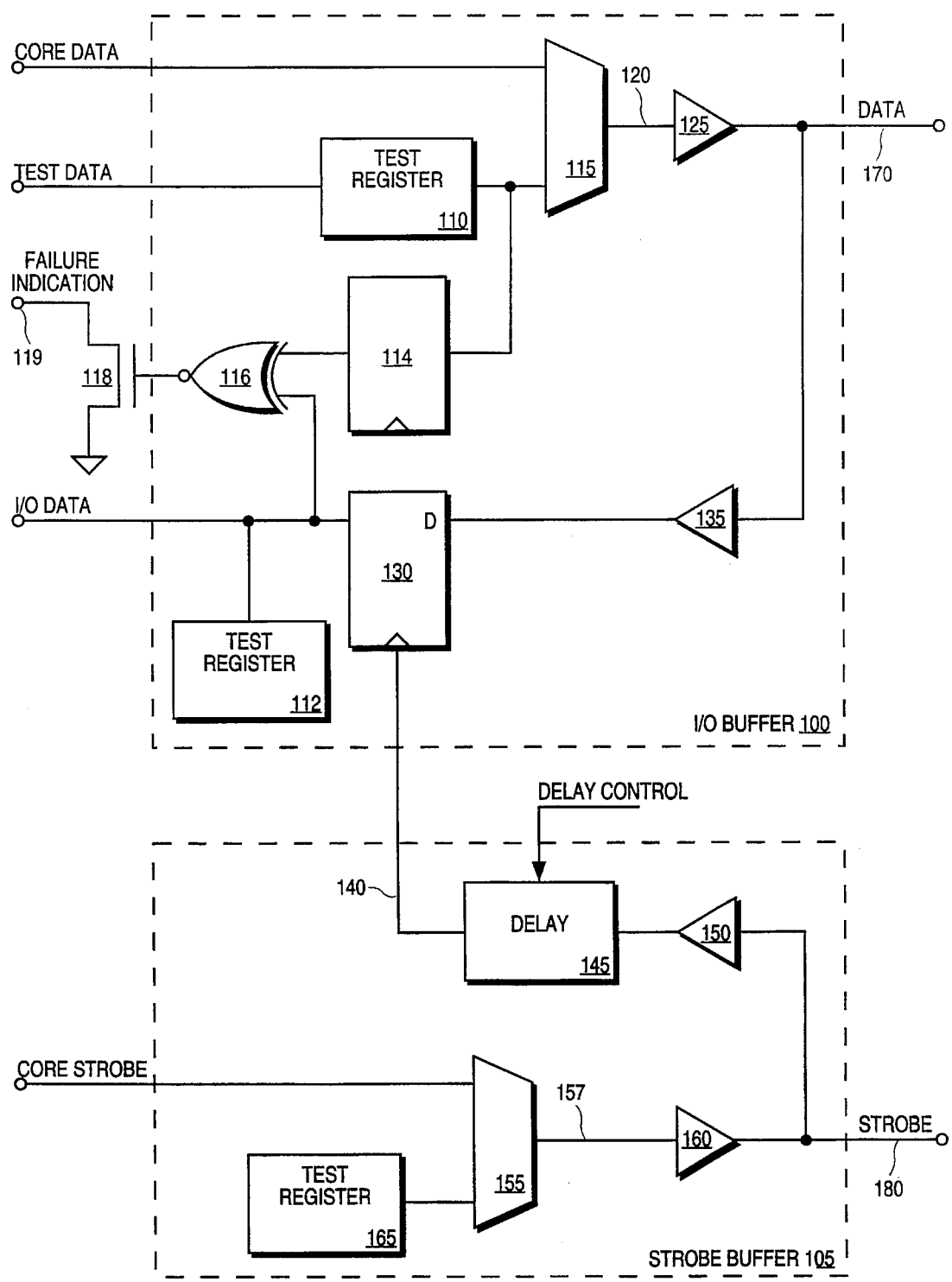
FIG. 1 is a schematic representation of a buffer circuit of the present invention.

FIG. 1 illustrates one self-testing buffer of the present invention. Typically, a plurality of these buffers provides an I/O interface between one integrated circuit and a system. Each buffer includes an I/O buffer circuit 100, whereas a strobe buffer circuit 105 may be shared with a group of I/O buffer circuits. The I/O and strobe buffer circuits transfer data from the integrated circuit to the system via a first interface node 170 and a second interface node 180. In a test mode the strobe buffer circuit provides the I/O buffer circuit with a delayed strobe signal on a signal line 140, thereby allowing self-test and characterization.

The I/O buffer circuit drives the first interface node 170 according to a data input node 120 using an output buffer 125. A multiplexer 115 selects the data input node from a CORE DATA line and an output of a test register 110. The test register 110 is a data test register which received data from a TEST DATA line and which can be a part of either a serial test chain or a parallel test register.

An input portion of the I/O buffer receives a data value from the first interface node 170 and drives this data value to an input latch 130 using an input buffer 135. The input latch 130 has a clock input coupled to the signal line 140 to receive the delayed strobe signal from the strobe buffer circuit. The input latch provides a sampled value at the input latch output. The sampled value is then sent as I/O DATA to the core and to a second test register 112. This second test register 112 is particularly useful in isolating which I/O buffer fails and may be part of either a serial test chain or a parallel test register.

When it is necessary to detect that a failure exists but not which specific circuit fails, a failure indication signal can be examined to determine the test status of a plurality of buffers. This failure indication signal is asserted on a failure indication line 119 by feedback comparison circuitry which compares an expected value to the sampled value for each buffer. In the illustrated embodiment, the feedback comparison circuitry includes an exclusive nor gate 116 which compares the value from a test feedback latch 114 to the sampled value provided by the input latch 130. Alternate embodiments employ only one of the failure indication line and the test register 112 to detect incorrect values.

A failure indicated on the failure indication line may be due to a faulty strobe buffer circuit. When properly functioning, the strobe buffer circuit drives a strobe signal on the second interface node 180 using an output buffer 160. A strobe input node 157 selected by a multiplexer 155 from a CORE STROBE line and a third test register 165 provides an input signal to the second output buffer 160. An input buffer 150 couples the strobe signal to an input of an adjustable delay circuit 145. The adjustable delay circuit receives a delay control signal on a delay adjust input and accordingly provides the delayed strobe signal on the signal line 140 to the clock input of the input latch 130. The delay control signal may be directly coupled from an interface of the integrated circuit or may be coupled to test control logic.

In a non-test mode, the I/O buffer circuit 100 drives the first interface node 170 and the second interface node 180 approximately simultaneously. This is typically accomplished by properly controlling the timing of the core data and the core strobe signals. In an alternate embodiment, a clocked output circuit effectuates the dispatch of core data and strobe signals. In either case, data and strobe are provided at the interface nodes substantially simultaneously. Data and strobe signals are carefully routed to their destinations to maintain these timing relationships.

In a test mode, the strobe and data signals are again driven to the interface nodes substantially simultaneously; however, in this case, the signals originate from the test registers 110 and 165. The strobe signal propagates through the adjustable delay circuit and clocks the input latch. This strobe signal creates a window in which data can be captured by the input latch. If the data from the test register 110 is not driven to the interface node 170 and captured by the input latch 130 during this window, the sampled value at the input latch output will not properly reflect the data value driven by the output buffer 125. The delay control signal can be used to adjust the window in which data is captured by the input latch, thereby allowing characterization of the I/O buffer circuit. By analyzing the contents of test registers such as the test register 112, an I/O buffer circuit exhibiting unacceptable performance may be detected.

This self-testing technique could be applied to a wide variety of buffers. Any buffer which captures data based on an incoming strobe signal could adjust a strobe delay to alter a capture window for the incoming data. This technique is particularly advantageous where data and strobe signals are generated on a single integrated circuit, thereby allowing testing to proceed without requiring the application of test stimulus to interface nodes such as interface nodes 170 and 180.

Figure 2:
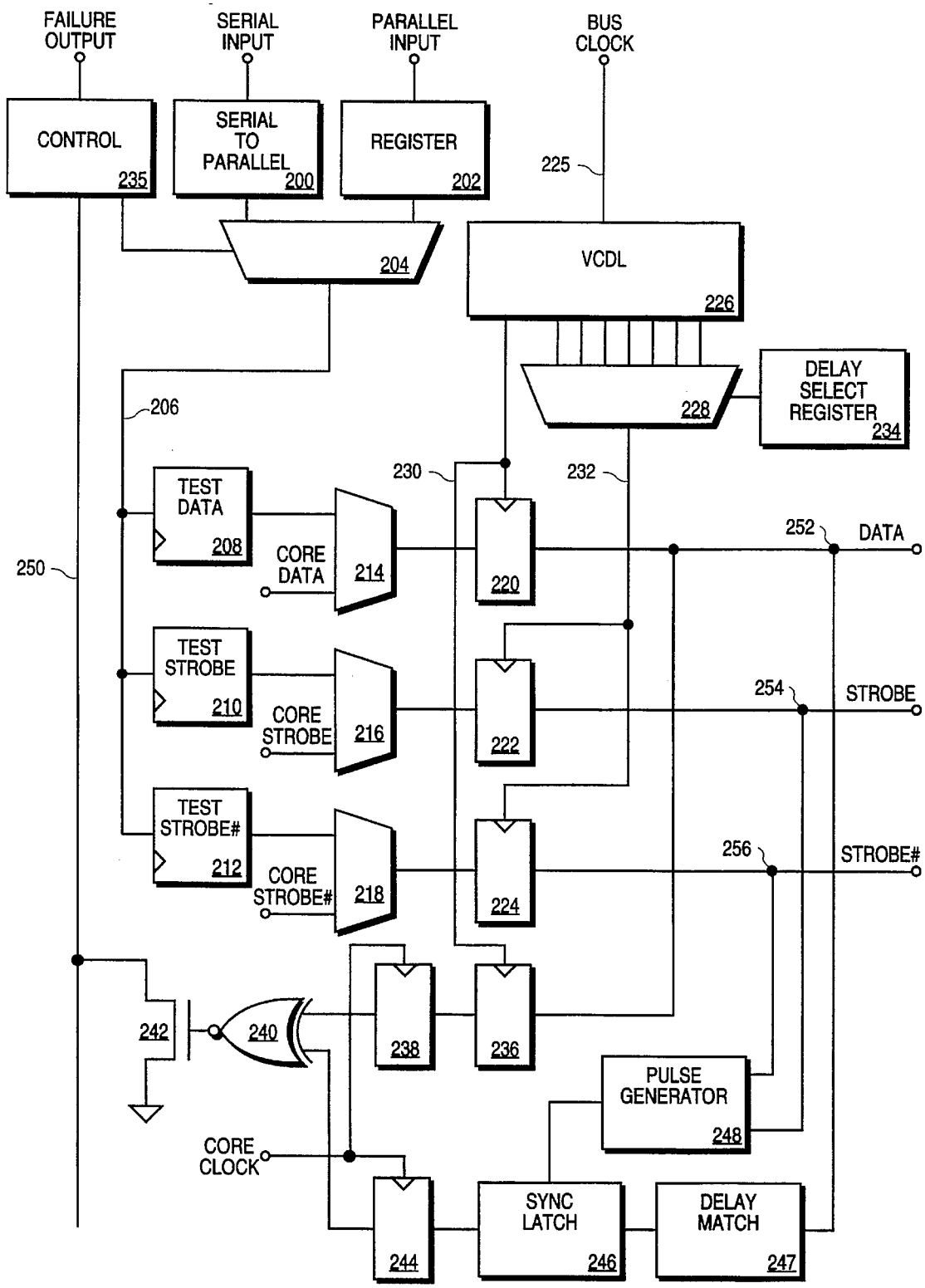
FIG. 2 is one embodiment of a self-testing buffer system of the present invention.

FIG. 2 illustrates one embodiment of the invention which accomplishes buffer characterization by skewing output timings. That is, the relative timing relationships between the data and the strobe signals are adjusted by varying output circuit enable signals.

As in FIG. 1, the circuitry of FIG. 2 can be used with a plurality of I/O buffer circuits on an integrated circuit. In addition to illustrating an alternate delay adjustment technique, FIG. 2 illustrates additional test control structures which may be used with any of the adjustable delay circuits discussed herein.

While alternate embodiments require only serial or parallel test input, this embodiment provides test control structures to utilize test data from either type of source. A control circuit 235 selects a multiplexer 204 to couple SERIAL INPUT from a serial to parallel converter 200 or PARALLEL INPUT from a register 202 to a test register bus 206. The test register bus couples the input to a plurality of test registers including a test data register 208, a test strobe register 210, and a test strobe# register 212. The test register bus may include a serial bus or a parallel bus, or any other coupling mechanism which provides values from the multiplexer to the test registers.

The data test register 208 is coupled by a multiplexer 214 to an output circuit representatively indicated by a latch 220. The control circuit provides the multiplexer 214 with a multiplexer control signal to make this connection during the test mode. Similarly, a multiplexer 216 connects test strobe register 210 and a latch 222, and a multiplexer 218 connects test strobe# register 212 and a latch 224 during the test mode.

The output circuits (e.g. latches 220–224) may be any type of output buffer or output latch which drives an output signal in response to a clock, strobe, or enable signal. This includes clocked or enabled Gunning Transceiver Logic (GTL), CMOS, or bipolar output buffers. This also includes latches or other storage elements having sufficiently sized output stages. As described below, the output circuit responds to the variably timed output enable signals from the adjustable delay circuit.

The latch 220 drives a value from the data test register to an interface node 252 in response to a first I/O clock provided on a data enable line 230. The strobe and strobe# signals are respectively driven from the strobe and strobe# test registers 210 and 212 to interface nodes 254 and 256 in response to a second I/O clock provided on a strobe enable line 232.

The first and second I/O clock signals are derived from a bus clock provided on signal line 225. A voltage controlled delay line (VCDL) 226 acts as an adjustable delay circuit which skews the second I/O clock relative to the first I/O clock by adjustably delaying the second I/O clock. A multiplexer 228 uses a value from a delay select register 234 to select an output from one of a plurality of stages (not shown) of the VCDL as the second I/O clock.

Any of the variety of voltage controlled delay lines known in the art may be used. Such delay lines typically bias a voltage controlled resistance (e.g. a transistor) to vary the delay through a plurality of stages. One implementation biases one transistor which is in series with another transistor forming part of a logic gate such as an inverter. Another implementation (shown in FIG. 4) biases a transistor to provide a voltage controlled load for each delay stage.

In the illustrated embodiment, the timing of the strobe and strobe# signals at nodes 254 and 256 is controlled by selecting a particular tap in the delay line. A control voltage, which controls the delay of each stage of the delay line, is coupled to a compensation circuit (not shown) which generates a bias voltage to compensate for operating conditions and processing variations. In an alternate embodiment, a simple multi-stage delay line having tapped stages replaces the VCDL. In yet another embodiment, the delay select register adjusts the bias voltage controlling each individual stage of the voltage controlled delay line. Essentially, any integrated variable delay circuit could be used.

The variably delayed strobe and strobe# signals propagate to a pulse generator circuit 248 which provides pulses to a synchronizing latch circuit 246. The synchronizing latch circuit functions as a latch having a latch clock input coupled to the pulse generator circuit. Thus, as in FIG. 1, the adjustable delay circuit is coupled to provide a delayed strobe to the latch clock input. In one mode, a delay matching circuit 247 is coupled between the interface node 252 and the synchronizing latch circuit to compensate for the pulse generator delay in the strobe signal paths.

In FIG. 2, certain input circuits such as input buffers are not shown. One example of an input circuit is the input buffer displayed in FIG. 1; however, a wide variety of input circuits may be used with the present invention to synchronize, buffer, or otherwise couple incoming data signals to the input latching circuit(s).

In order to properly capture the incoming data from the interface node 252, the pulse generator circuit provides a plurality of pulses to a plurality of latching circuits (not shown) in the synchronizing latch circuit. The strobe and strobe# signals are respectively used to generate the rising and falling edges of each of the plurality of pulses in order to provide a more reliable capture window. Each of the plurality of pulses is delayed slightly with respect to the previous pulse. The plurality of latching circuits within the synchronizing latch circuit are coupled to a core clocked latch 244 via a multiplexer which is also within the synchronizing latch circuit. The latching circuits are sequentially selected using this multiplexer to provide synchronized incoming data to the latch 244.

The latch 244, as well as a latch 238, are clocked by a core clock signal. The latch 238 provides an expected value by reflecting a feedback data value from a test feedback latch 236. The test feedback latch is coupled to capture test data from a node prior to the interface node 252. As shown, the test feedback latch 236 captures the expected value from after the latch 220. Alternately, the expected value may be captured from the output of the multiplexer 214 or from the test data register 208. The test feedback latch 236 must be properly clocked so that it captures the expected value from the node to which it is connected. In the illustrated embodiment, the first I/O clock provided on the data enable line 230 controls both the test feedback latch 236 and the latch 220 to which the test feedback latch is coupled.

An equivalence comparator, exclusive nor gate 240, is coupled to compare the expected value provided by the latch 238 to the incoming value provided by the latch 244. If these values do not match, a transistor 242 asserts a failure signal on a failure indication line 250. In one embodiment, the failure indication line is precharged by the control circuit and forms a wired-OR between a plurality of I/O buffers. That is, a transistor associated with each I/O buffer is coupled to discharge the failure indication line if there is a mismatch between the expected value and the incoming value for that I/O buffer.

The control circuit reflects the failure signal on a FAILURE OUTPUT node. The control circuit is also responsible for proper execution of each test. The control circuit may be a hard-wired or microcoded control circuit which tests the I/O buffers utilizing a sequence of strobe delays and/or a sequence of data values. These data values can be coupled to test data registers through the use of the register 202 which may be either a general purpose register or a special test register. Alternately, the control circuit may utilize data from the serial input. In either case, the control circuit provides test data to the output circuits, properly enables the input and output circuits, and indicates failures.

Testing I/O buffers over a range of delays provides useful characterization information. In one embodiment, the adjustable delay circuit is capable of causing failures due to a strobe signal which is too early or too late. In other words, both input setup and hold times (both sides of the capture window) can be characterized. Whether this entire range of delays is tested for an I/O buffer or set of I/O buffers depends on the testing environment. In a development test environment, it may be desirable to vary the delay control signal until the input latch fails to capture the data input. This type of development characterization can be useful in circuit optimizations and in defining production test specifications. In a production test environment, the testing may also be repeated for a plurality of strobe delays; however, the worst case strobe delays used in the production environment are not expected to cause most parts to fail.

Thus, the source synchronous buffer circuit in FIG. 2 can be tested efficiently in a development or production test environment. This circuit may in fact be operated utilizing a small number of interface nodes since the data and strobe signals can be generated on a single integrated circuit. The ability to perform such tests on many buffers while only requiring access to a few interface nodes allows the use of substantially less expensive test equipment prior to assembly.

Figure 3:
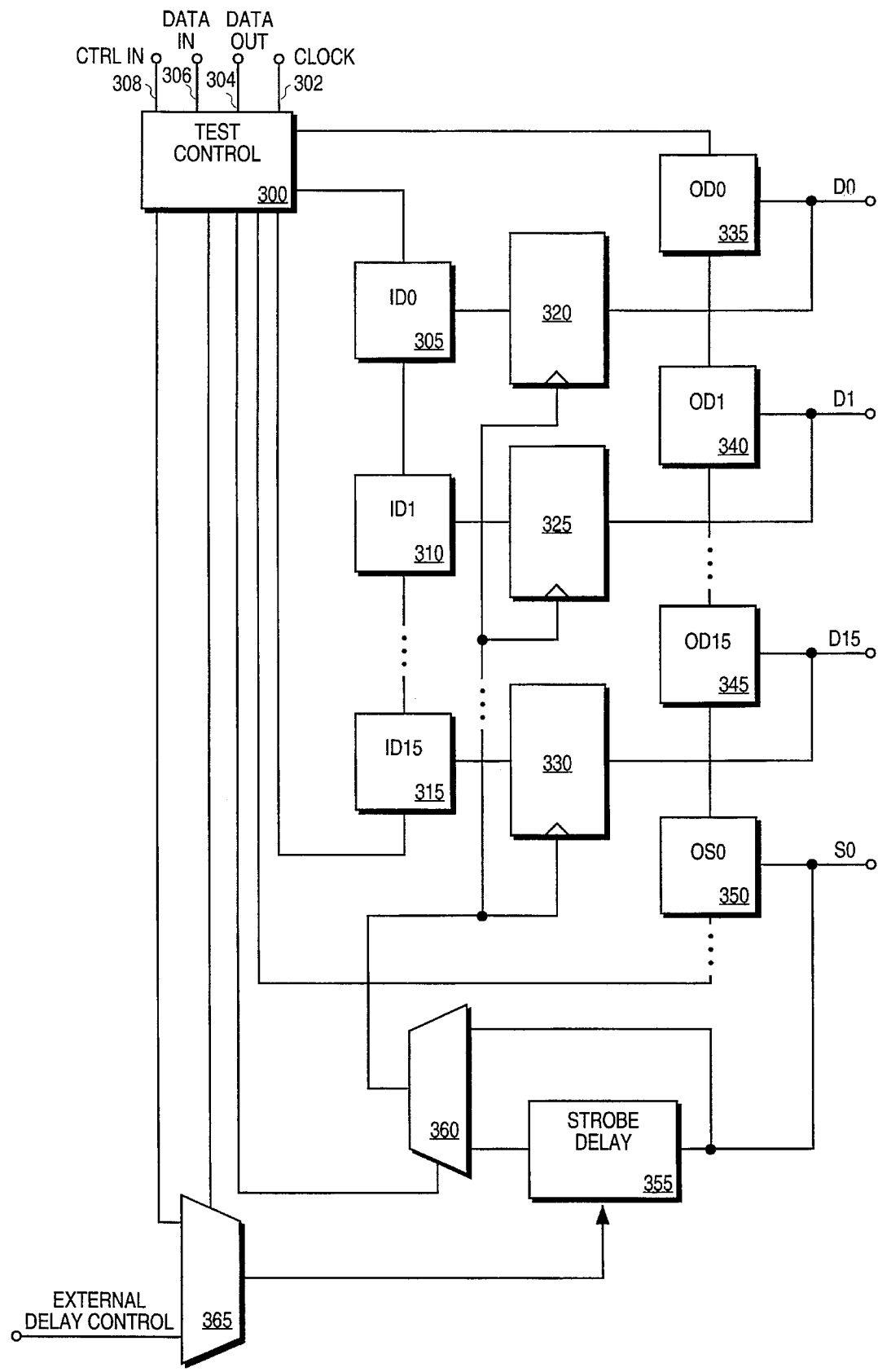
FIG. 3 is another embodiment of a self-testing buffer system of the present invention.

FIG. 3 shows an embodiment of the present invention which utilizes serially accessed scan chains rather than register arrays which may be accessed in parallel. The embodiment of FIG. 3 typically consumes less die space at the expense of increased test time necessitated by the serial operations involved.

A test control circuit 300 provides test initiation, test execution, and test result output. In some cases, the test result output may be as simple as serially shifting captured data out of a data output interface. In one embodiment, the test execution includes selecting several bit patterns and looping through several different delays similar to the control circuit of FIG. 2. In order to minimize die consumption some of the functionality required for the operations may be provided using routines executed by an integrated circuit tester (not shown).

In one embodiment, the test control circuit is a serial controller compliant with the test access port specification described by the IEEE std. 1149.1-1990, published Feb. 15, 1990. This standard allows users to define custom instructions and custom data registers. Such custom instruction and data registers can be used to initiate and define parameters for tests on buffers of the present invention.

In the embodiment of FIG. 3 the test control circuit 300 has four interface signals used for test control. These are a clock interface 302, a data output interface 304, a data input interface 306, and a control input 308. These interfaces provide access to test instructions and serially linked test registers. As shown, a plurality of serially linked scan chains are coupled to the test control circuit. Alternately, all of the necessary test registers could be serially linked in a single scan chain.

Test registers 305, 310, and 315 are input data (ID) registers serially linked in a first scan chain which captures data contained in input latches 320, 325 and 330. A second serially linked scan chain includes output data (OD) and strobe (OS) registers such as test registers 335, 340, 345 and 350. This second scan chain provides data and strobe signals which are driven by output buffers and used in the sampling performed by the input latches. To perform a test, the test control circuit shifts values into the data and strobe scan cells of the second scan chain. The test control circuit then generates a control signal which causes the values loaded into the data and strobe scan cells to be driven by output buffers (not shown).

The test control circuit selects a first multiplexer 360 such that the first multiplexer output reflects a delayed strobe signal generated through a strobe delay 355 allowing the test to vary the strobe delay. Delay adjustment is accomplished through either external control or via a register within the test control circuit as selected by a second multiplexer 365. The delayed strobe signal is coupled to the input latches 320–330 which capture the data driven by the output buffers from the data scan cells 335–345. Subsequently, the test registers 305, 310, and 315 capture the data from the input latches. This data may then be serially shifted out by the test control circuit on its data output interface where it can be compared to expected values by an integrated circuit tester.

The integrated circuit tester may continue to run a plurality of tests including different data sequences as well as different delay choices for the strobe delay circuit. Again, in a development test environment, the strobe delay is often varied until the tests fail. In a production environment, the variation in the strobe delay typically represents a window wherein most parts are expected to properly perform.

Figure 4:
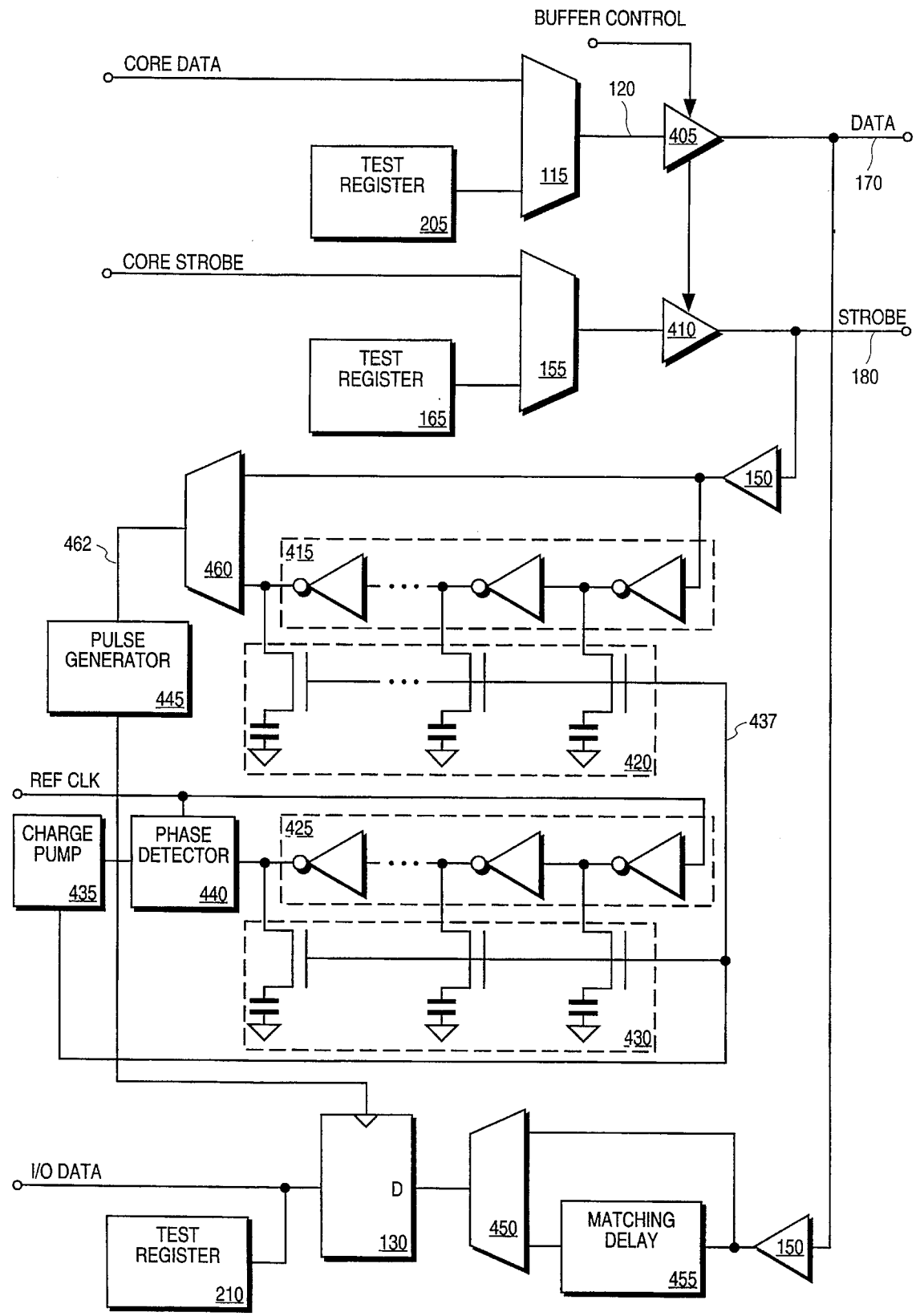
FIG. 4 is a detailed schematic representation of a buffer circuit of the present invention.

FIG. 4 illustrates further details of a buffer circuit of the present invention. Particularly, this figure illustrates an embodiment which utilizes a first delay chain 425, a phase detector 440, and a charge pump 435 to form a delay locked loop to provide an adjustable delay based on a reference clock signal REF CLK. Additionally, in this embodiment output buffers 405 and 410 are controlled by buffer control signals provided over a buffer control line or bus.

As previously, the data and strobe signals are driven from test registers by output buffers to the interface nodes 170 and 180. The strobe signal arrives at a second delay chain 415 from the test register 165 after passing through the multiplexer 155, the output buffer 410 and the input buffer 150. When the test mode is active, a delay multiplexer 460 selectively couples an output of the second delay chain 415 to a delay multiplexer output 462. The second delay chain may in one embodiment include a plurality of inverters which have coupled thereto a plurality of delay control elements 420 which are controlled by a delay control output signal provided on a delay control output line 437. In this embodiment, each delay control element may be a transistor having a gate biased by the delay control output signal, a source coupled to the delay chain, and a drain coupled by a capacitor to a voltage supply. In the test mode, the delay multiplexer output is a delayed strobe signal delayed by a varying amount depending on the delay control output signal on line 437.

A pulse generator circuit 445 is used in this embodiment in order to provide increased control over the duration of the strobe window during which data is captured. Two or more strobe signals could also be coupled to the pulse generator as illustrated in FIG. 2. Each additional strobe requires additional input and output circuitry as well as an additional adjustable delay chain controlled according to the delay control output line 437.

The delay lock loop utilizes the first delay chain 425 which produces a delayed reference clock from a reference clock input REF CLK. A phase detector 440 compares the phase of the delayed reference clock to the reference clock signal itself and appropriately biases a plurality of delay control elements 430 to adjust the first delay chain 425.

To make this bias adjustment, the phase detector provides to the charge pump 435 a control signal responsive to a phase difference between the delayed reference clock and the reference clock. The charge pump then generates a voltage proportional to this phase difference on the delay control output line 437. The delay control output signal, thus provided on the line 437, controls both pluralities of delay control elements 420 and 430 when it adjusts the delay of the first delay chain 425 to match the phase of the delayed reference clock with the reference clock. Thus, by adjusting the frequency of the reference clock, the delay of both the first delay chain 425 and the second delay chain 415 can be adjusted.

An external reference clock (REF CLK) allows precise control over the delay of the first and second delay chains despite processing variations on a particular integrated circuit. As the reference clock frequency is varied, the phase detector and charge pump adjust the delay control output signal on line 437 according to the externally generated reference clock frequency. This allows consistent and controllable I/O buffer characterization despite manufacturing process excursions.

Alternately, any other adjustable delay circuit could by used. In fact, an on-chip adjustable delay circuit which varies with process variations may prove at least as useful if it tracks with the I/O buffers and accurately delineates when actual failures will occur.

Whichever adjustable delay technique is chosen, the delayed strobe signal is used to latch data in the input latch 130. As previously, the pulse generator 445 may generate a plurality of staggered pulses which capture data in a plurality of latch cells (not shown) which may form the input latch 130. This approach is used to improve data capture and synchronization. In order to compensate for the delay in the strobe signal caused by the pulse generator circuit, a matching delay 455 can be selected using a multiplexer 450. This matching delay is most crucial in normal operation because proper operation requires that the data input to the input latch arrives during the capture window.

In alternate embodiments, latching hardware may be conserved in several ways. Instead of providing separate test registers, existing I/O latches may be modified to capture test data and cooperate in serial or parallel test operations using multiplexers and some additional control logic. Existing test registers such as registers already present to comply with the IEEE 1149.1 standard may be similarly modified to support the additional test functionality described.

Figure 5:
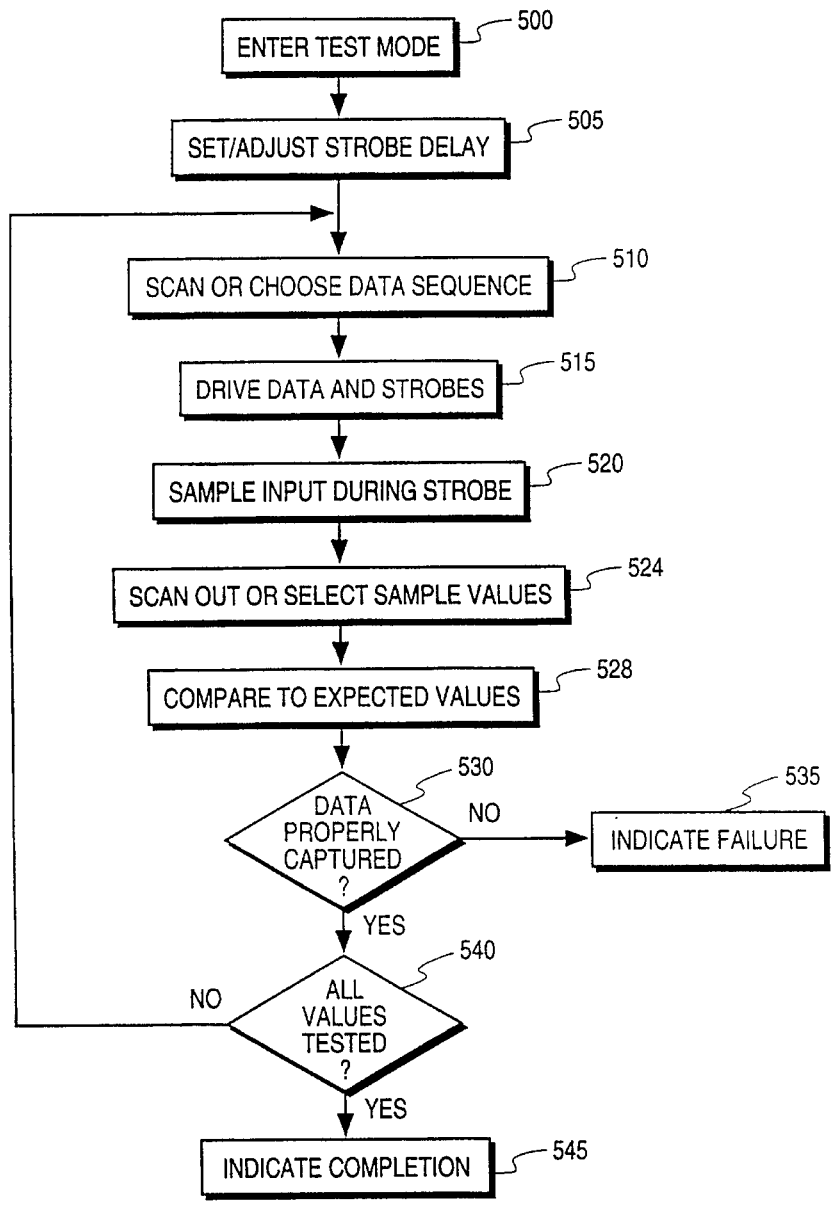
FIG. 5 is a flow chart illustrating a method for self-characterization of a buffer of the present invention.

FIG. 5 illustrates a method of self characterization of the buffer of the present invention. The method begins by entering a test mode in step 500. Depending on the embodiment of the test control logic used, this step may comprise asserting a test initiation signal or executing a test initiation sequence. After entering the test mode, the strobe delay is set or adjusted in step 505, and a data sequence is scanned in serially or chosen by control logic in step 510. A particular data sequence can be serially scanned in using one or more scan chains as previously described. The data sequence can also be loaded in parallel from a register or a pattern generation circuit. Once the appropriate data is loaded into the test registers, the data and strobe are driven in step 515.

The strobe propagates to data input latches which sample the data inputs in step 520. The various sampled inputs form a data sequence which is then scanned out serially or selected by control logic for parallel comparison in step 524. A comparison of the data sequence to expected values is performed in step 528. If the data has not been properly captured as tested in step 530, a failure indication is given in step 535. If the data was properly captured, testing continues with step 540.

If additional strobe delay values need to be tested, the method returns to step 505 where the strobe delay is then adjusted. If all values have been tested, completion is indicated in step 545. Thus, a plurality of strobe delays can be used to characterize an I/O buffer to determine a capture window in which the input latch properly captures values by the output buffer. This flow chart indicates one particular sequence which may be used; however, various manipulations of driven and captured data may be used without departing from the spirit of using a variable capture window defined by an adjustable delay circuit.

Thus, the method and apparatus of the present invention provides for buffer self-testing and characterization. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A self-testing buffer circuit comprising:

an input circuit having an input circuit output, and an input circuit input coupled to receive a data value generated by the self-testing buffer circuit;

a latch having a latch clock input and a latch input coupled to the input circuit output; and an adjustable delay circuit having a delay adjust input, a strobe input, and a delay circuit output coupled to provide a delayed strobe at the latch clock input.

2. The self-testing buffer circuit of claim 1 wherein the latch has a latch output and the self-testing buffer circuit further comprises:

a comparison circuit having a first comparison circuit input coupled to receive the latch output, a second comparison circuit input which receives an expected data value.

3. The self-testing buffer circuit of claim 2 further comprising:

an output circuit coupled to selectably drive the data value from a test data node to an interface node; and a test feedback latch having a test feedback latch input coupled to receive the data value and having a test feedback latch output coupled to the second comparison circuit input.

4. The self-testing buffer circuit of claim 3 wherein the comparison circuit comprises:

a transistor coupled to discharge a failure indication line; and an equivalence comparator coupled to compare the first and the second comparison circuit inputs and to enable the transistor.

5. The self-testing buffer circuit of claim 1 further comprising:

a first output circuit coupled to drive the data value from a data input node to an interface node;

a second output circuit coupled to drive a strobe from a strobe input node to a second interface node;

a second input circuit coupling the strobe input of the adjustable delay circuit to the second interface node.

6. The self-testing buffer circuit of claim 1 wherein the adjustable delay circuit comprises:

a first delay chain having a first delay chain input, a first delay chain output, and a first delay chain adjustment input;

a second delay chain having a second delay chain adjustment input, the second delay chain coupling the strobe input to the delay circuit output;

a delay control circuit coupled to the delay adjust input, the first delay chain input, and the first delay chain output, and having a delay control output coupled to the first delay chain adjustment input and the second delay chain adjustment input.

7. The self-testing buffer circuit of claim 6 wherein the delay adjust input is coupled to receive a clock signal and the delay control circuit comprises:

a charge pump having a charge pump output coupled to the first delay chain adjustment input and the second delay chain adjustment input;

a phase comparator coupled to receive the clock signal and coupled to the first delay chain output, the phase comparator having a phase comparator output controlling coupled to the charge pump.

8. The self-testing buffer circuit of claim 1 wherein the latch has a latch output and the self-testing buffer circuit further comprises:

a test register having a test register output and a test register parallel input coupled to the latch output;

a test control circuit controlling coupled to the test register.

9. The self-testing buffer circuit of claim 8 wherein the test register is a scan latch and the test control circuit is serially coupled to a scan chain comprising the scan latch.

10. The self-testing buffer circuit of claim 9 further comprising:

a first output circuit coupled to drive the data value from a data input node to an interface node;

a first multiplexer with a first multiplexer output coupled to the data input node selected from a test input line and a core data line;

a second output circuit coupled to drive a strobe from a strobe input node to a second interface node;

a second input circuit coupling the second interface node to the strobe input of the adjustable delay circuit.

11. The self-testing buffer circuit of claim 10 wherein the scan chain further comprises:

a second test register serially coupled to the test control circuit and having a second test register output forming the test input line.

12. A buffer circuit comprising:
  a first output circuit coupled to drive a value from a data input node to a first interface node;
  a second output circuit coupled to drive a strobe from a strobe input node to a second interface node;
  a latching circuit coupled to capture the value responsive to the strobe;
  an adjustable delay circuit coupled to delay the strobe before the strobe reaches the latching circuit.

13. The buffer circuit of claim 12 wherein the adjustable delay circuit provides a first buffer control signal to the first output circuit and provides an adjustably delayed buffer control signal to the second output circuit.

14. The buffer circuit of claim 12 wherein the adjustable delay circuit has a delay circuit input coupled to receive the strobe from the second interface node and has a delay circuit output coupled to a clock input of the latching circuit.

15. The buffer circuit of claim 12 wherein the latching circuit is a synchronizing latch circuit.

16. The buffer circuit of claim 12 wherein the latching circuit has a latching circuit output and the buffer circuit further comprises:
  a comparison circuit coupled to compare the latching circuit output and an expected data value and coupled to assert a failure indication signal.

17. The buffer circuit of claim 12 wherein the latching circuit has a latching circuit output and the buffer circuit further comprises:
  a first test register having a first test register output;
  a first multiplexer having a first multiplexer output, the first multiplexer coupled to select from at least a core data line and the first test register output;
  a second test register having a second test register input coupled to the latching circuit output.

18. The buffer circuit of claim 17 further comprising:
  a third test register having a third test register output;
  a second multiplexer having a second multiplexer output coupled to the strobe input node and selected from at least the third test register output and a core strobe node.

19. The buffer circuit of claim 18 further comprising:
  a test control circuit serially coupled to the first test register, the second test register, and the third test register.

20. The buffer circuit of claim 19 wherein the first test register, the second test register, and the third test register are serially coupled in at least one scan chain.

21. An integrated circuit comprising:
  a test control circuit having a data input, a control input, a data output, and a control bus;
  a strobe buffer which is coupled to the control bus and which generates a strobe signal in response to a signal received from the test control circuit;
  an adjustable delay circuit which is coupled to receive the strobe signal, and which generates a delayed strobe signal;
  a data scan cell, coupled to the control bus, serially coupled to the data input and the data output of the test control circuit, and coupled to an input circuit to capture a data value latched by the input circuit responsive to the delayed strobe signal.

22. The integrated circuit of claim 21 further comprising:
  a strobe scan cell, coupled to the control bus, serially coupled to the data input and the data output of the test control circuit, and coupled to the strobe buffer to generate the strobe signal in response to the signal from the test control circuit.

23. The integrated circuit of claim 21 wherein the adjustable delay circuit is adjusted by the test control circuit.

24. The integrated circuit of claim 21 wherein the adjustable delay circuit is adjusted by a clock input.

25. The integrated circuit of claim 21 further comprising:
  an input latch that latches the data value according to the delayed strobe signal.

26. A method for self-testing a buffer circuit, comprising the steps of:
  (a) setting a strobe delay;
  (b) driving a data signal representing a data value;
  (c) generating a delayed strobe signal according to the strobe delay;
  (d) sampling a sampled value of the data signal using the delayed strobe signal;
  (e) testing whether the sampled value corresponds to the data value.

27. The method of claim 26 wherein step (e) further comprises the step of:
  serially shifting the sampled value to a serial output.

28. The method of claim 26 further comprising the step of:
  (f) repeating steps (a) through (e) for a plurality of strobe delays.

29. The method of claim 26 wherein step (a) further comprises the step of:
  adjusting a test clock input frequency.

30. The method of claim 26 wherein step (e) further comprises the step of:
  comparing the sampled value to the data value.

* * * * *

UNITED STATES PATENT AND TRADEMARK OFFICE
CERTIFICATE OF CORRECTION

PATENT NO. : 5,621,739
DATED : April 15, 1997
INVENTOR(S) : Sine et al.

It is certified that error appears in the above-identified patent and that said Letters Patent is hereby corrected as shown below:

In the Abstract at [57] in line 3 delete "stroke" and insert --strobe--

In the Abstract at [57] in line 13 delete "resisters" and insert --registers--

In column 10 at lines 39-40 delete "controlling" and insert --controllingly--

In column 10 at line 46 delete "controlling" and insert --controllingly--

Signed and Sealed this

Twenty-second Day of July, 1997

Attest:

BRUCE LEHMAN

Attesting Officer

Commissioner of Patents and Trademarks